United States Patent [19]
Chang et al.

[11] Patent Number: 5,627,394
[45] Date of Patent: May 6, 1997

[54] LD-MOS TRANSISTOR

[75] Inventors: Chi-Sung Chang, Tempe; Judith L. Sutor, Chandler, both of Ariz.

[73] Assignee: Motorola, Inc., Schaumburg, Ill.

[21] Appl. No.: 599,898

[22] Filed: Feb. 12, 1996

[30]     Foreign Application Priority Data

Mar. 6, 1995 [JP] Japan ................... 7-045416

[51] Int. Cl.$^6$ .................. H01L 29/76; H01L 23/58
[52] U.S. Cl. .............. 257/335; 257/336; 257/337; 257/338; 257/493
[58] Field of Search ................. 257/221, 327, 257/333, 334, 335, 336, 342, 344, 389, 395, 408

[56]          References Cited

U.S. PATENT DOCUMENTS 5,306,652  4/1994  Kwon et al. .
5,406,110  4/1995  Kwon et al. ................ 217/335
5,429,959  7/1995  Smayling ..................... 437/34
5,502,323  3/1996  Kitamura et al. ............. 257/335

*Primary Examiner*—Sara W. Crane
*Assistant Examiner*—Fetsum Abraham
*Attorney, Agent, or Firm*—Robert F. Hightower

[57]            ABSTRACT

An object of the present invention is to provide an LD-MOS transistor with a reduced device real estate and high breakdown strength. An extended drain region doped with phosphorus is formed in contact with an underside of an insulation layer and a drain diffusion region, respectively. The insulation layer is deposited over a conductive gate layer and a drain diffusion region, respectively.

3 Claims, 3 Drawing Sheets

LD-MOS TRANSISTOR

TECHNICAL FIELD

The present invention relates to an LD (lateral diffused) MOS transistor.

BACKGROUND

An LD-MOS transistor is known as a switching transistor for driving the load that requires a high drive current, such as a motor.

FIG. 1 shows the structure of such an n-channel LD-MOS transistor.

In FIG. 3, an n well 9 is formed on a surface of a p-type silicon semiconductor substrate 11, and in the n well 9 is formed a p body region 26 as a p-type diffusion region. On the surface of the p body region 26 is formed an n$^+$ source region 27. On the surface of the n well 9 is formed an n$^+$ drain region 28. A gate insulation layer 21 is deposited on the surfaces of the n$^+$ source region 27, p body region 26, n well 9 and n$^+$ drain region 28. A conductive gate layer 22 is deposited on the gate insulation layer 21. A source electrode S is connected to the p body region 26 and n$^+$ source region 27. A gate electrode G is connected to the conductive gate layer 22. A drain electrode D is connected to the n$^+$ drain region 28.

With such an LD-MOS transistor, a channel Q which determines the turn-on resistance during the switching operation is formed between the boundary of the n$^+$ source region 27 underlying the gate insulation layer 21 and the boundary of the p body region 26. Thus, with this LD-MOS transistor, the turn-on resistance can be lowered by reducing the channel length, without reducing the distance between the n$^+$ source region 27 and drain region 28.

With the LD-MOS transistor as shown in FIG. 1, a structure is known where breakdown strength is increased by widening the gap between the n$^+$ source region 27 and drain region 28.

FIG. 2 shows one example of such an LD-MOS transistor, where like parts shown in FIG. 1 are denoted by the same reference symbols.

With such an LD-MOS transistor, breakdowns strength can be controlled by forming an insulation layer 18 thicker than the gate insulation layer 21 through diffusion of SiO$_2$ and so on, thereby permitting any distance to be set (over the diffusion) between the n$^+$ source region 27 and drain region 28.

However, with such an LD-MOS transistor, there is a problem that because the distance between the n$^+$ source and drain regions 27 and 28 must be widened according to the increasing breakdown strength, the real estate occupied by the device itself is also increased. Furthermore, because the breakdown strength value of such a transistor also depends on the depth of the n well 9, a method is also available for achieving increased breakdown strength by increasing the depth of the n well 9; however, the depth of the n well 9 is limited in terms of manufacturability, so that a desired breakdown strength value cannot be obtained.

Accordingly, it is an object of the present invention to provide an LD-MOS transistor that is easily manufacturable and also permits switching operation with a minimized real estate of the device and increased breakdown strength.

SUMMARY OF THE INVENTION

An LD-MOS transistor according to the present invention comprises:

a source region of a second conductivity type formed on a surface of a silicon semiconductor substrate of a first conductivity type, the polarity of said first and second conductivity types being opposite to each other; a drain region of said second conductivity type, forming a channel region between said source region and said drain region; and a conductive gate layer overlying via a gate insulation layer on said channel region, and further comprising:

a body region of said first conductivity type surrounding said source region and having a dopant concentration higher than that of said silicon semiconductor substrate;

an extended drain region of said second conductivity type, formed in said channel region toward said source region, said extended drain region being in contact with said drain region; and an additional insulation layer formed between said extended drain region and said conductive gate layer, said additional insulation layer being thicker than said conductive gate layer, wherein said extended drain region is doped with phosphorus.

The LD-MOS transistor according to the present invention comprises a body region that surrounds the source region and has a dopant concentration higher than that of the silicon semiconductor substrate; a conductive gate layer overlying through the gate insulation layer on the channel region between the source region and drain region; an extended drain region formed in contact with the drain region and toward the source region, said extended drain region doped with phosphorus; and an additional insulation layer formed between the extended drain region and conductive gate layer, said additional insulation being thicker than said conductive gate layer.

DETAILED DESCRIPTION OF THE PREFFERED EMBODIMENT

Figure 3:
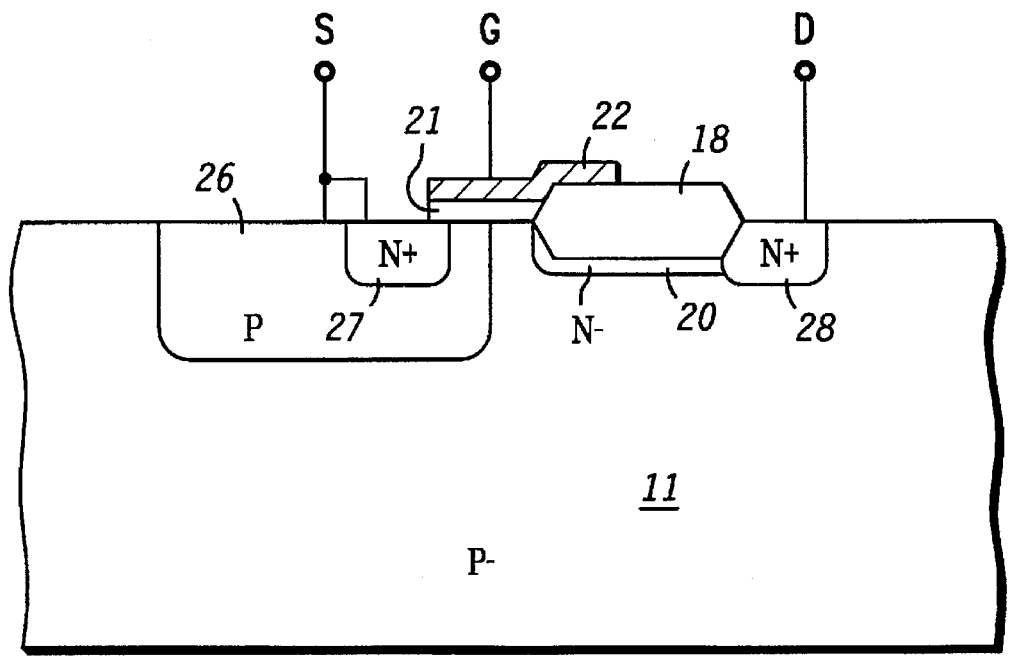
FIG. 3 schematically shows a LD-MOS transistor according to the present invention.

FIG. 3 shows the structure of an LD-MOS transistor according to the present invention.

In FIG. 3, on a surface of a relatively lightly doped p-type silicon semiconductor substrate 11 is formed a p body region 26 as a more heavily doped p-type diffusion region than the silicon semiconductor substrate 11. On a surface of the p body region 26 is formed an n$^+$ source region 27 as a relatively heavily doped n-type diffusion region. Furthermore, on the surface of the silicon semiconductor substrate 11 is formed an n$^+$ drain region 28 as a relatively heavily doped n-type diffusion region. On a channel region between the n$^+$ source and n$^+$ drain regions 27 and 28 is formed a conductive gate layer 22 via a gate insulation layer 21. An insulation layer 18 consisting of $SiO_2$ and so on, which is formed more thickly than the gate insulation layer 21, is formed between the conductive gate layer 22 and the $n^+$ drain region 28.

Furthermore, an $n^-$ extended drain region doped more lightly with phosphorus than is the $n^+$ drain region 28 is formed extending within the channel region in contact with the underside of the insulation layer 18.

Next, the manufacturing process for the LD-MOS transistor is described with reference to FIGS. 4 and 5.

Figure 4:
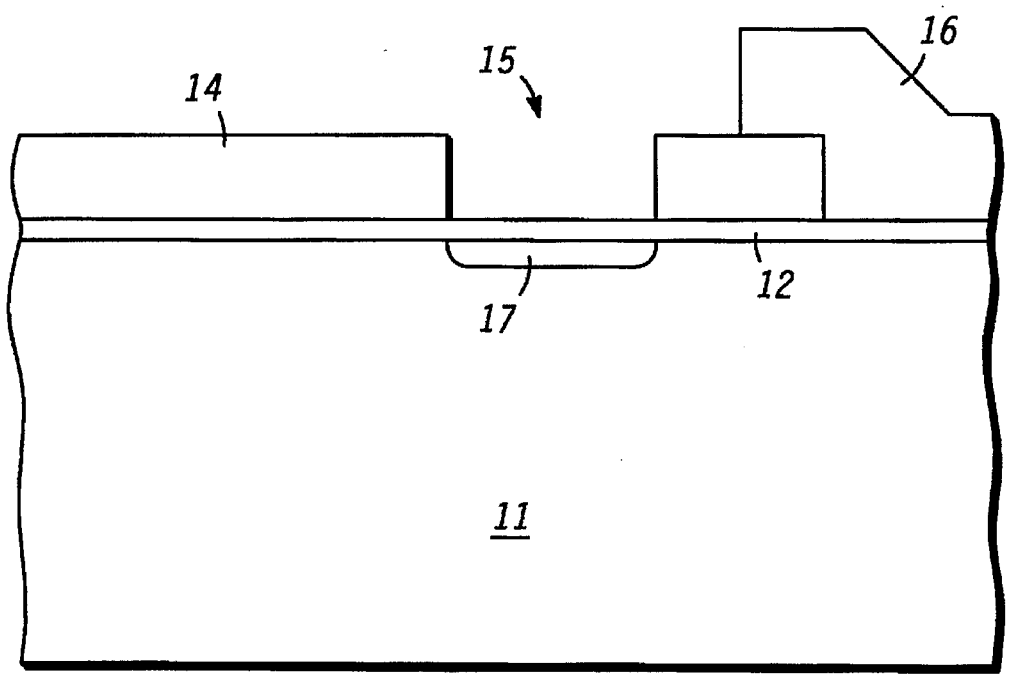
FIG. 4 is an illustration for explaining the manufacturing process for the LD-MOS transistor according to the present invention.

In FIG. 4, an oxide layer 12 is formed on a relatively lightly doped p-type silicon semiconductor substrate 11. The thickness of the oxide layer 12 is determined by the subsequent silicon selective oxidation (LOCOS: Local Oxidation of Silicon) process. A nitride layer mask 14 is laminated on the oxide layer 12, and then patterned and etched to expose an implantation region 15 and form an insulation layer 18 for use in the subsequent steps. The nitride layer mask 14 has a preferred thickness of approximately 1400–1500 angstroms. A photoresist mask 16 of photoresist material is used to block the implantation in regions that do not require an $n^-$ extended drain region 20. An $n^-$ dopant 17 is implanted into the implantation region 15. During this process, phosphorus is implanted as the $n^-$ dopant 17 at approximately 60 KeV over a range from $3.0 \times 10^{12}$ to $5.0 \times 10^{12}$ atoms/cm$^2$. Such implantation of the $n^-$ dopant 17 causes the $n^-$ extended drain region 20 to be formed as shown in FIG. 5. Because phosphorus is used as the $n^+$ dopant 17, its diffusion is implemented quickly so that the $n^-$ extended drain region 20 is formed acceptably.

Figure 5:
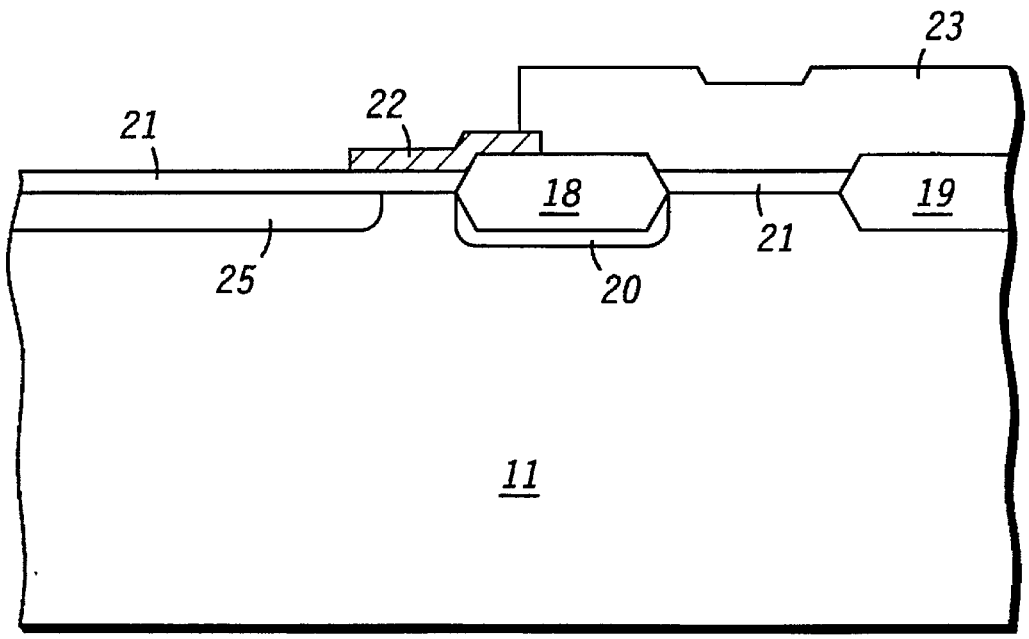
FIG. 5 is an illustration for explaining the manufacturing process for the LD-MOS transistor according to the present invention.

In FIG. 5, the photoresist mask 16 is removed after the implantation described above. Selective oxidation of silicon is performed using the existing nitride mask 14 so that the $n^-$ extended drain region 20 is self-aligned to the insulation layer 18. After the selective oxidation of silicon, the nitride layer mask 14 and oxide layer 12 are removed. The gate insulation layer 21 is formed over the entire surface of the transistor, with a preferred thickness of 200–1000 angstroms, according to each specific purpose. Next, a conductive gate 22 made of polysilicon is deposited to cover the entire surface of the transistor 10. The conductive gate 22 is doped with POC 13 so that it has a preferred thickness of 3000–5000 angstroms and a preferred resistance of 10–60 ohms/square. Next, the conductive gate 22 is patterned to cover the insulation layer 18 over the gate insulation layer 21, so that it overlaps with the oxide layer 18. The length of the conductive gate 22 covering the insulation layer 18 is, preferably, from 1.2 µm to 1.7 µm. At least 0.3 µm of overlapping distance of the conductive gate 22 and insulation layer 18 is required so that they overlaps with each other. A photoresist mask 23 made of photoresist material is used to block the implantation to regions that do not require a channel region 24. The channel region 24 is self-aligned to the conductive gate 22, so that a minimum turn-on resistance Ron is obtained. A P- dopant 25 is implanted into the implantation region 24. In a preferred embodiment, boron is implanted at an implantation energy of approximately 40 kV over a range from $3.0 \times 10^{13}$ to $3.5 \times 10^{13}$ atoms/cm$^2$.

Figure 6:
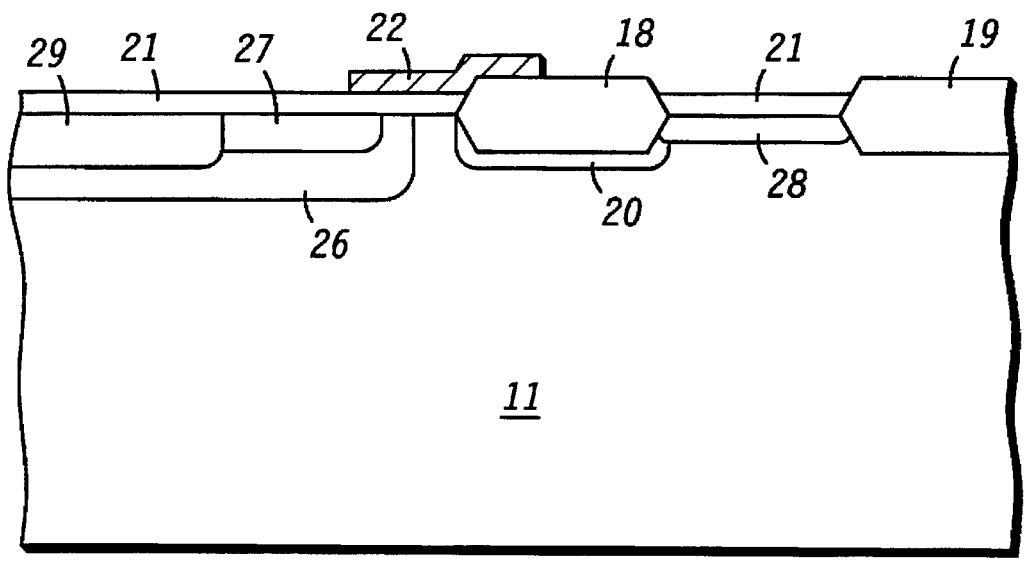
FIG. 6 is an illustration for explaining the manufacturing process for the LD-MOS transistor according to the present invention.

Next, the photoresist mask 23 is removed in FIG. 6. A P-implantation dopant 25 is then diffused to form a channel of the transistor and a body region 26. During this process, diffusion is performed for approximately 20 minutes at about 1100° C. Then, an implantation region 27 for the source region 27 is defined in the body region 26 by a masking step. During this process, implantation of the drain region 28 is self-aligned to the insulation layers 18 and 19. These regions are heavily doped with an n dopant which is doped with the same dopant and concentration as for a typical CMOS $N^+$ source/drain implantation in order to save the process steps. Subsequently, the mask is removed. In the next masking step, a back-gate contact region 29 is defined in the body region 26. The back-gate contact region 29 is heavily doped with a p dopant which is doped with the same dopant and concentration as for a typical CMOS $P^+$ source/drain implantation in order to save the process steps. Subsequently, the mask is removed. These dopants are implanted for about 30 minutes at approximately 900° C. in order to form the source region 27, drain region 28, and back-gate contact region 29.

During this process, the above implantation is the same as a typical CMOS process. The remaining process is the same as a well-known typical CMOS process.

Figure 1:
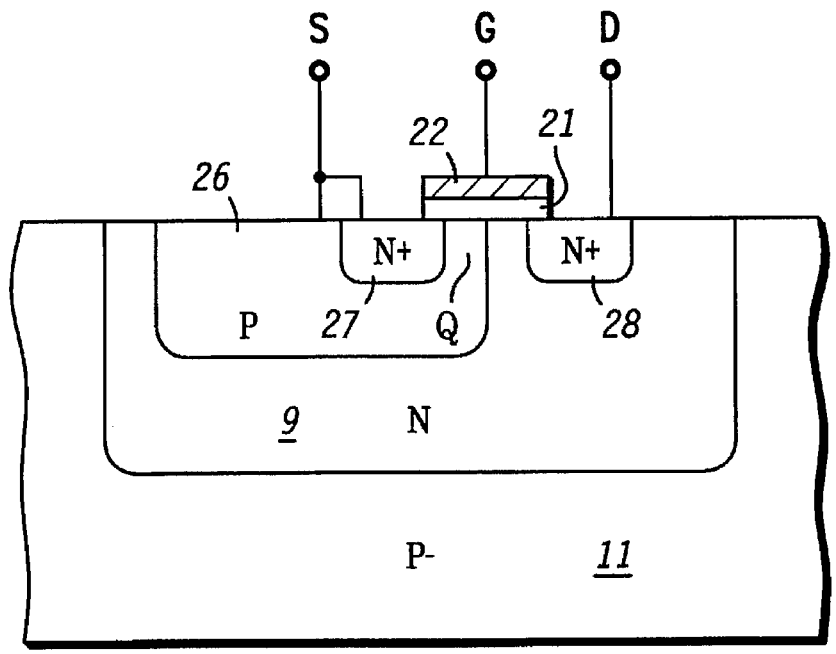
FIG. 1 schematically shows a prior art LD-MOS transistor.
Figure 2:
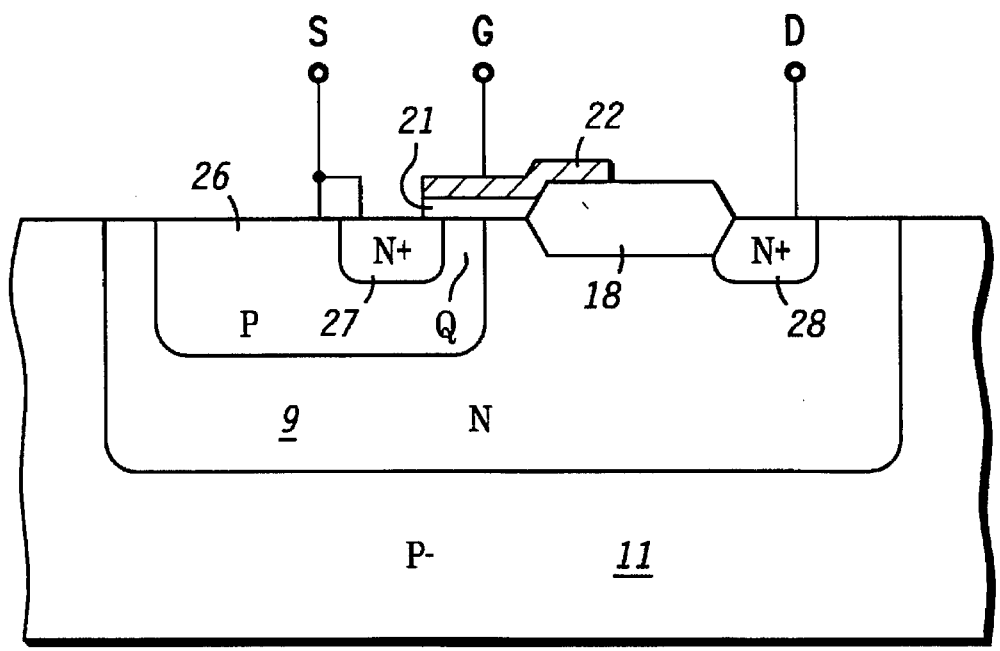
FIG. 2 schematically shows a prior art LD-MOS transistor.

As described above, with the LD-MOS transistor according to the present invention, by providing the $n^-$ extended drain region 20 in contact with the underside of the insulation layer 18 and the drain region 28, respectively, the necessity of the n well 9 as shown in FIG. 2 is eliminated. Thus, because its breakdown strength value depends on the capacitance of the silicon semiconductor substrate 11 itself, an LD-MOS transistor with high breakdown strength can be achieved without increasing the gap between the $n^+$ source region 27 and $n^+$ drain region 28. Furthermore, because the $n^-$ extended drain region 20 is formed through a relatively rapid diffusion by use of phosphorus as a dopant, it is advantageously formed acceptably with a simple manufacturing process.

As is clear from the above description, an LD-MOS transistor according to the present invention comprises a body region (26) that surrounds a source region (27) and has a higher dopant concentration than a silicon semiconductor substrate (11); a conductive gate layer (22) formed via a gate insulation layer (2) over a channel region between the source region (27) and drain region (28); an extended drain region (20) doped with phosphorus and formed in contact with the drain region (28) and toward the source region (27); and an additional insulation layer (18) formed between the extended drain region (20) and conductive gate layer (22), and having a greater thickness than the conductive gate layer (22).

Therefore, according to the present invention, an LD-MOS transistor which has a reduced real estate and allows for switching operation with high breakdown strength can be advantageously achieved through a straightforward manufacturing process.

What is claimed is:

1. An LD-MOS transistor comprising:

a source region of a second conductivity type formed on a surface of a silicon semiconductor substrate of a first conductivity type, the polarity of said first and second conductivity types being opposite to each other; a drain region of said second conductivity type, forming a channel region between said source region and said drain region; and a conductive gate layer overlying via a gate insulation layer on said channel region, and further comprising:

a body region of said first conductivity type surrounding said source region and having a dopant concentration higher than that of said silicon semiconductor substrate;

an extended drain region of said second conductivity type, formed in said channel region toward said source region, said extended drain region being in contact with said drain region wherein a portion of the first conductivity type substrate separates the extended drain region from the body region; and an additional insulation layer formed between said extended drain region and said conductive gate layer, said additional insulation layer being thicker than said conductive gate layer, wherein said extended drain region is doped with phosphorus.

2. An LD-MOS transistor according to claim 1, wherein said extended drain region is more lightly doped with phosphorus than is said drain region.

3. An LD-MOS transistor according to claim 1, wherein said extended drain region is doped with phosphorus at an implantation energy of 60 KeV over a range from $3.0 \times 10^{12}$ to $5.0 \times 10^{12}$ atoms/cm$^2$.

* * * * *